United States Patent
Yu et al.

(10) Patent No.: US 9,249,494 B2
(45) Date of Patent: Feb. 2, 2016

(54) METHOD FOR PRODUCING METAL FILM OF TOUCH PANEL

(71) Applicant: Paragon Technologies Co., Ltd., Taoyuan County (TW)

(72) Inventors: Ching-Feng Yu, Taoyuan County (TW); Min-Hsiang Yang, Taoyuan County (TW)

(73) Assignee: PARAGON TECHNOLOGIES CO., LTD., Gueishan Township, Taoyuan (TW)

( * ) Notice: Subject to any disclaimer, the term of this patent is extended or adjusted under 35 U.S.C. 154(b) by 450 days.

(21) Appl. No.: 13/926,281

(22) Filed: Jun. 25, 2013

(65) Prior Publication Data

US 2014/0374239 A1 Dec. 25, 2014

(51) Int. Cl.
*C23C 14/34* (2006.01)
*C23C 14/04* (2006.01)
*C23C 14/58* (2006.01)
*G06F 3/00* (2006.01)

(52) U.S. Cl.
CPC ........... *C23C 14/042* (2013.01); *C23C 14/5873* (2013.01); *G06F 3/00* (2013.01)

(58) Field of Classification Search
CPC ...... C23C 14/042; C23C 14/5873; G06F 3/00
USPC .............. 204/192.12, 192.15, 192.17, 192.21
See application file for complete search history.

(56) References Cited

U.S. PATENT DOCUMENTS

2007/0205855 A1* 9/2007 Hashimoto ............. H01F 5/003
336/200

* cited by examiner

*Primary Examiner* — Rodney McDonald
(74) *Attorney, Agent, or Firm* — Muncy, Geissler, Olds & Lowe, P.C.

(57) ABSTRACT

A method for producing a metal film of a touch panel provided by the present invention has the steps of: preparing a base plate; coating a mask on the surface of the base plate; using a sputtering process to sputter a metal material on the part of the base plate where is not covered by the mask; removing the mask so as to form a metal film and a hollow area; and using a laser engraving process to remove an over coating area that is produced by the metal film or the hollow area so as to produce the metal film.

9 Claims, 5 Drawing Sheets

METHOD FOR PRODUCING METAL FILM OF TOUCH PANEL

BACKGROUND OF THE INVENTION

1. Field of the Invention

The present invention generally relates to a touch panel, more particularly to a touch panel that is made by a sputtering process and a laser engraving process.

2. Description of the Related Art

The input way of many electronic devices is changed from an early keyboard input mode changed to a touch or touch input mode, hence the touch or touch input operation interface makes operation easier, and the thickness of the electronic device is thinner.

The touch input mode of the touch panel is by capacitive mostly. That is, a user's finger or a sensing pen is used to touch on the surface of the touch panel. The internal touch panel of the touch position generates a capacitance difference so as to detect the touched position of the surface of the touch panel, so as to achieve the purpose of the touch sensing. There are generally two ways to manufacture the sensing circuit, sensing the touch of a user, of a capacitance touch panel. The first is to print a metal material after printing on a base plate, and then exposing, developing, etching, etc. are applied to produce the sensing circuit layer. The second is to use a laser engraving process to produce a needed sensing circuit layer.

Although above touch panels produced by the two processes have no problem on the use of touch-sensitive. Using printing, exposure, developing, etching, laser engraving, etc. to produce touch panel may take more hours and procedures, so that the relative increase of production costs. And using the aforementioned two processes can only make the sensing circuit layer on a plate-shaped substrate, then assembling with the plastic case of the touch panel, and can not directly make the sensing circuit layer of a touch panel on a case which cross-sectional is a stair-shape or an irregular-shaped.

SUMMARY OF THE INVENTION

The main objective of the present invention is to solve prior shortcomings. The present invention uses a sputtering process to make a metal film, such as a sensing circuit layer or an anti-electromagnetic interference layer, that is a must for a touch panel on a base plate. Thus, a laser engraving process is applied to trim an over coating area (or deckle edge) of the metal film in order to more easily produce a touch panel.

The other objective of the present invention is to use the sputtering process and the laser engraving process to directly make the sensing circuit layer of the touch panel on a case or the base plate which cross-section is a stair-shape, a plate-shape and an irregular-shaped.

To approach above objectives, the method for producing a metal film of a touch panel provided by the present invention has the steps of:
  preparing a base plate;
  coating a mask on the surface of the base plate;
  using a sputtering process to sputter a metal material on a part of the base plate not covered by the mask;
  removing the mask so as to form a metal film and a hollow area; and
  using a laser engraving process to remove an over coating area that is produced by the metal film or the hollow area so as to produce the metal film.
  wherein the base plate is made of a solid non-metal material.
  wherein the solid non-metal material is selected from the group consisted of: glass fiber, glass and plastic.
  wherein the cross-section of the base plate is a stair-shape.
  wherein the cross-section of the base plate is a plate-shape.
  wherein the mask is to shelter a part where is not necessary to sputter to form the metal film and is removed the metal film thereon by the laser engraving process later.
  wherein the metal film comprises a sensing circuit layer and an anti-electromagnetic interference layer.
  wherein the sensing circuit layer has a first electrical connecting portion, a second electrical connecting portion, a plurality of sensing areas, and a plurality of connecting lines.

BRIEF DESCRIPTION OF THE DRAWINGS

The objects, spirits, and advantages of the preferred embodiments of the present invention will be readily understood by the accompanying drawings and detailed descriptions, wherein.

DETAILED DESCRIPTION OF THE INVENTION

Following preferred embodiments and figures will be described in detail so as to achieve aforesaid objects.

Figure 1:
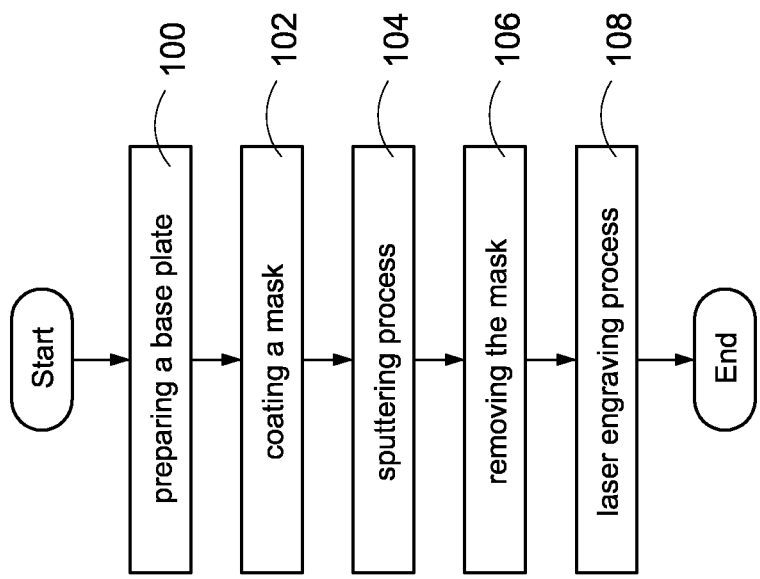
FIG. 1 illustrates a flow chart of a method for producing a metal film of a touch panel of the present invention.
Figure 2:
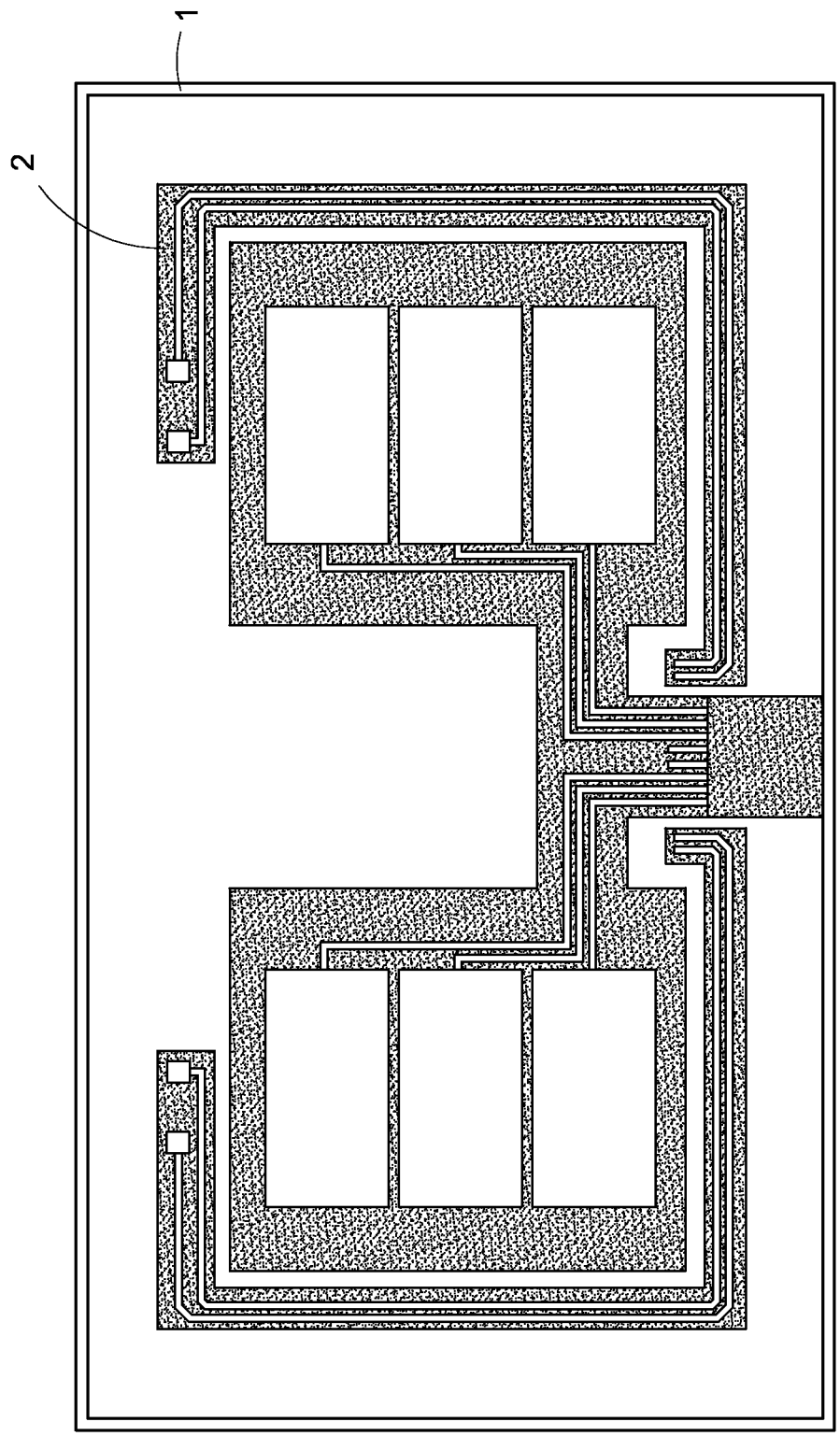
FIG. 2 illustrates a schematic view of a mask covering on the touch panel of the method for producing the metal film of the touch panel of the present invention.
Figure 3:
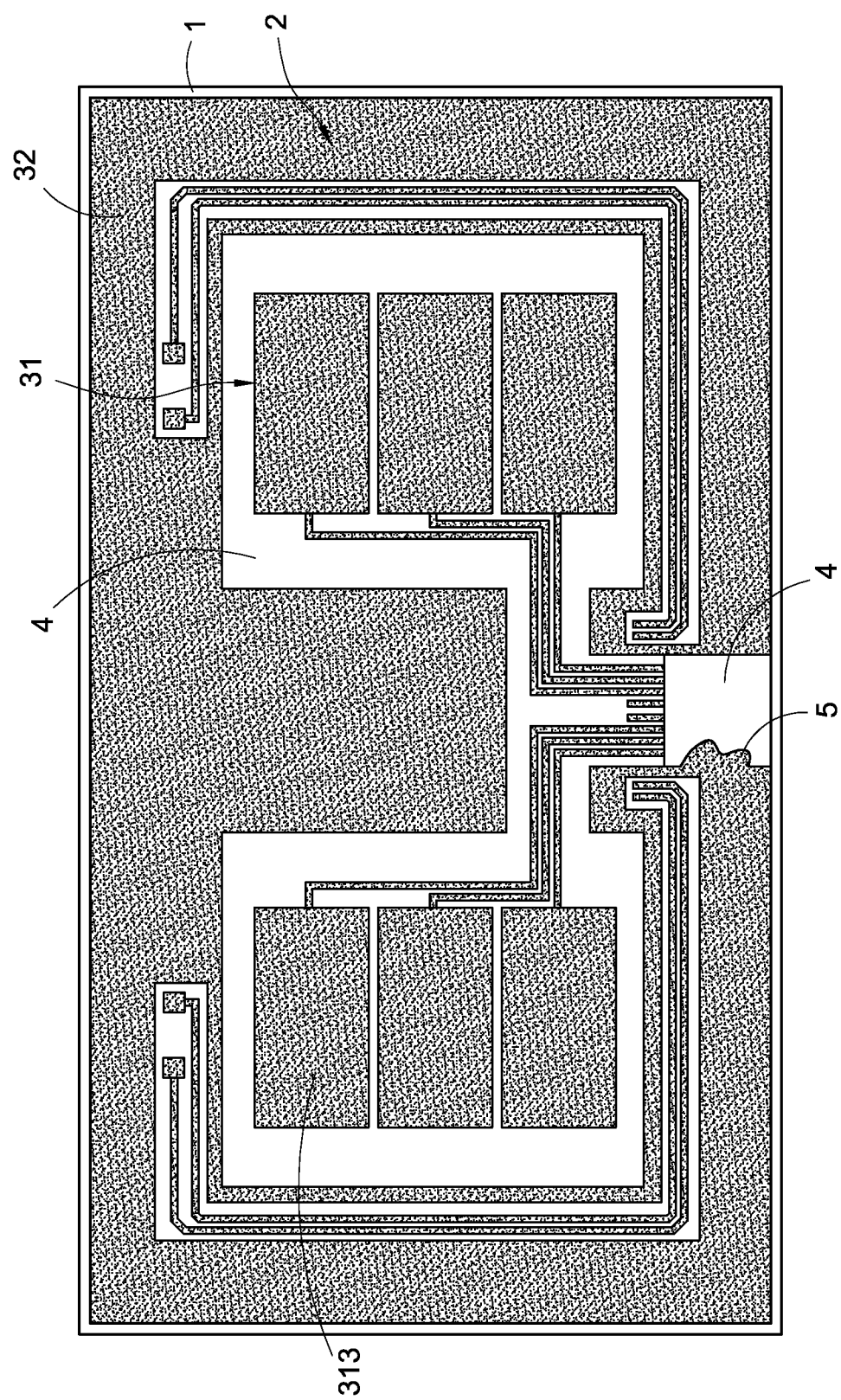
FIG. 3 illustrates a schematic view of removing the mask of the method for producing the metal film of the touch panel of the present invention.
Figure 4:
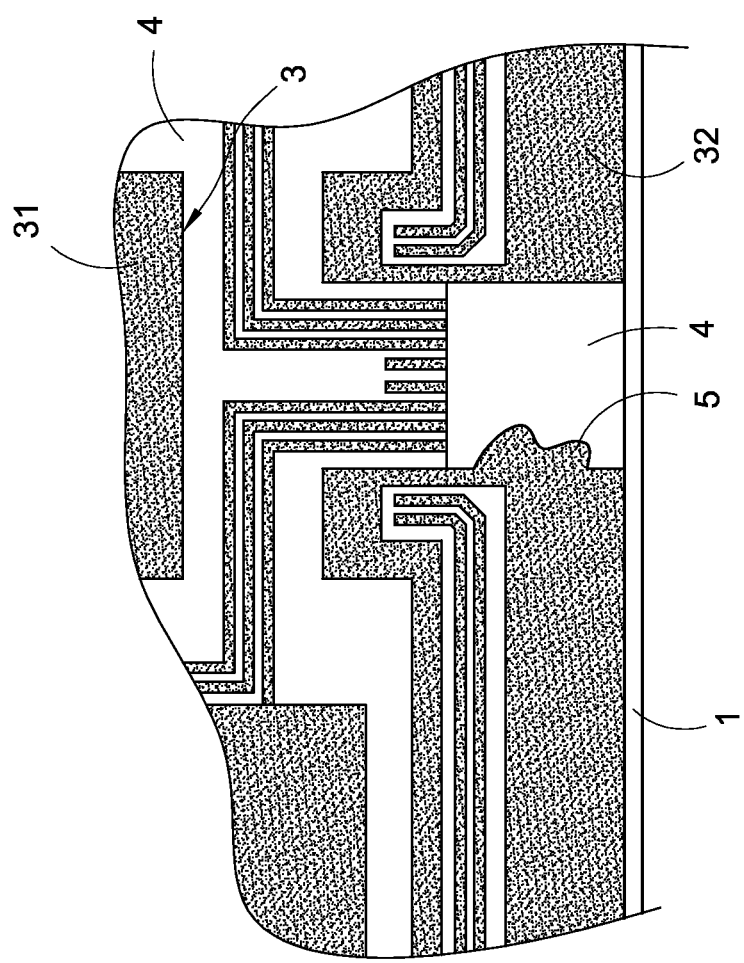
FIG. 4 illustrates a schematic enlarged view of FIG. 3.
Figure 5:
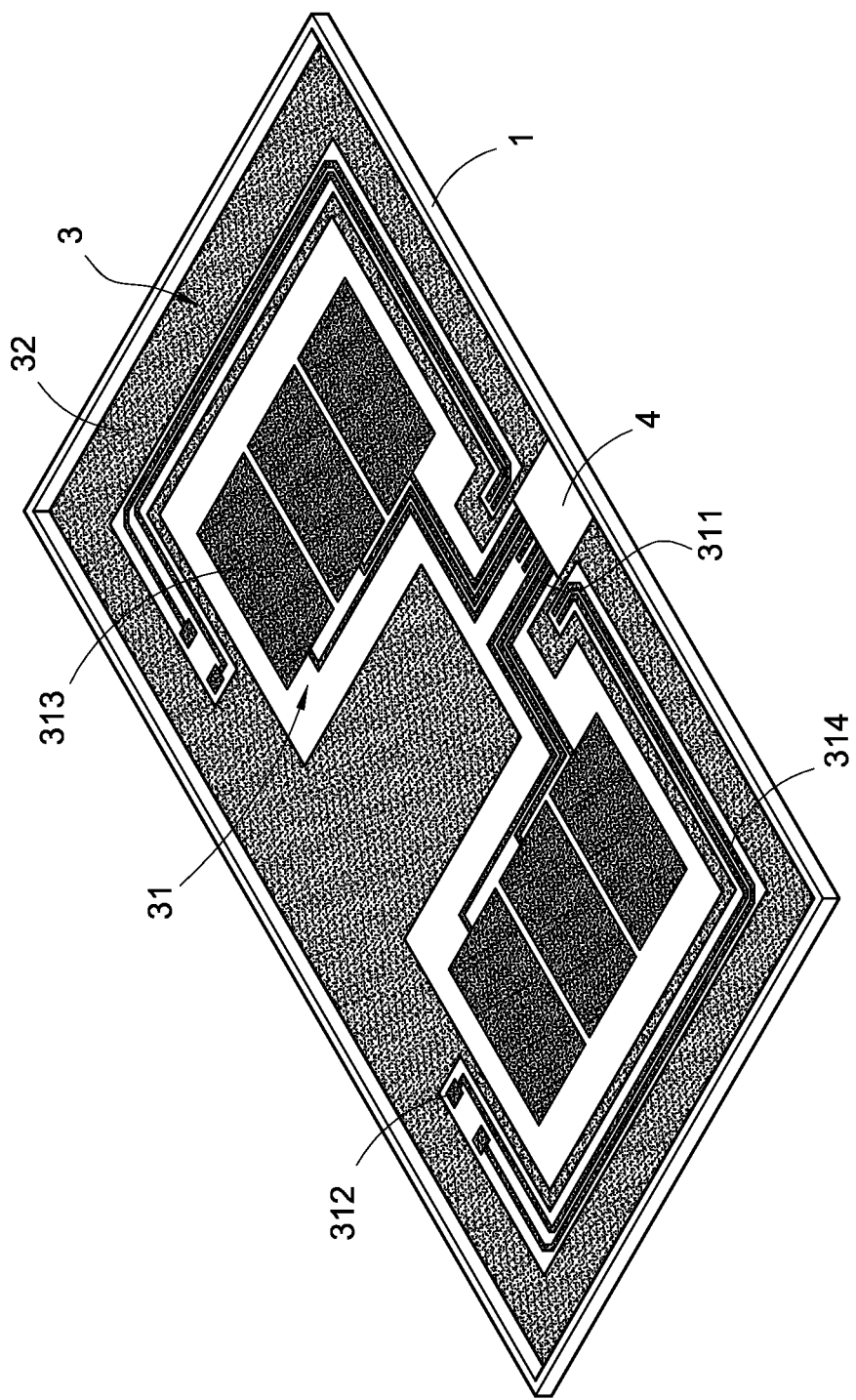
FIG. 5 illustrates a schematic view of a laser engraving process of over coating of the touch panel of the method for producing the metal film of the touch panel of the present invention.

Please refer to FIG. 1 to FIG. 5, which illustrate a flow chart of a method for producing a metal film of a touch panel of the present invention, a schematic view of a mask covering on the touch panel of the method for producing the metal film of the touch panel of the present invention, a schematic view of removing the mask of the method for producing the metal film of the touch panel of the present invention, and a schematic view of over coating of a laser engraving process of the method for producing the metal film of the touch panel of the present invention. As shown in figure, the method for producing the metal film of the touch panel includes the steps of:

(100) preparing a base plate 1, wherein the base plate 1 is made of a solid non-metal material, such as glass fiber, glass or plastic, and the cross-section of the base plate (or case) 1 is a stair-shape, a plate-shape and an irregular-shaped;

(102) coating a mask 2 on the surface of the base plate 1, wherein the mask 2 is to shelter a part where is not necessary to sputter to form the metal film 3 and is removed the metal film 3 thereon by a laser engraving process later after the metal film 3 is formed;

(104) after the mask 2 is covered, using a sputtering process to sputter a metal material on a part of the base plate 1 not covered by the mask 2;

(106) after the sputtering process, removing the mask 2 so as to form a metal film 3 and a hollow area 4, wherein the metal film 3 has a sensing circuit layer 31 and an anti-electromagnetic interference layer 32, or a sensing circuit layer 31 and an anti-electromagnetic interference layer 32 electrically connecting with the sensing circuit layer 31, as shown in FIGS. 3; and (108) after the mask 2 is removed and while the sensing circuit layer 31 or the hollow area 4 generates an over coating area (or deckle edge) 5, using the laser engraving process to remove the over coating area 5 that is produced by the sensing circuit layer 31 of the metal film 3 or the hollow area 4, as shown in FIG. 4, so as to produce the metal film 3, as shown in FIG. 5.

Please refer to FIG. 5, which illustrates a schematic view of the metal film of the method for producing the metal film of the touch panel of the present invention. As shown in figure, the touch panel has a base plate 1, a metal film 3 and a hollow area 4. While the cross-section of the base plate 1 is a stair-shape, the technologies of printing, exposure, development, etching, etc. cannot make a metal material to form the base plate 1; on the other hand, the sputtering process is the way to make the metal film 3 on the base plate 1.

The metal film 3 is on the base plate 1, and is consisted of a sensing circuit layer 31 and an anti-electromagnetic interference layer 32. The metal film 3 can be made on the base plate 1 by the sputtering process and the laser engraving process. The sensing circuit layer (31) has a first electrical connecting portion 311, a second electrical connecting portion 312, a plurality of sensing areas 313, and a plurality of connecting lines 314.

The hollow area 4 is on the base plate 1 for disposition of the sensing circuit layer 31. The larger hollow area 4 is for placing or adhering connection cables, thin-film circuit board or other electronic components. In fact, the larger hollow area 4 was removed by the laser engraving process, and therefore it cost a lot. Before the present invention goes to the sputtering process, the area where will be removed by the laser engraving process is sheltered by the mask 2. After the sputtering process is finished and the mask is removed as well, the laser engraving process is thus applied to remove an over coating area (or deckle edge) produced by the sputtering process, so that the cost of manufacturing a touch panel is highly decreased.

Further, according to the sputtering process and the laser engraving process, the sensing circuit layer of the touch panel can be directly made on the plastic case or the base plate which cross-section is a stair-shape, a plate-shape and an irregular-shaped.

Although the invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for producing a metal film of a touch panel comprising the steps of:
   preparing a base plate (1);
   coating a mask (2) on the surface of the base plate (1);
   using a sputtering process to sputter a metal material on a part of the base plate (1) not covered by the mask (2);
   removing the mask (2) so as to form a metal film (3) and a hollow area (4); and
   using a laser engraving process to remove an over coating area (5) that is produced by the metal film (3) or the hollow area (4) so as to produce the metal film (3).

2. The method for producing the metal film of the touch panel according to claim 1, wherein the base plate (1) is made of a solid non-metal material.

3. The method for producing the metal film of the touch panel according to claim 2, wherein the solid non-metal material is selected from the group consisted of: glass fiber, glass and plastic.

4. The method for producing the metal film of the touch panel according to claim 1, wherein the cross-section of the base plate (1) is a stair-shape.

5. The method for producing the metal film of the touch panel according to claim 1, wherein the cross-section of the base plate (1) is a plate-shape.

6. The method for producing the metal film of the touch panel according to claim 1, wherein the cross-section of the base plate (1) is an irregular-shaped.

7. The method for producing the metal film of the touch panel according to claim 1, wherein the mask (2) is to shelter a part where is not necessary to sputter to form the metal film (3) and is removed the metal film (3) thereon by the laser engraving process later.

8. The method for producing the metal film of the touch panel according to claim 7, wherein the metal film (3) comprises a sensing circuit layer (31) and an anti-electromagnetic interference layer (32).

9. The method for producing the metal film of the touch panel according to claim 8, wherein the sensing circuit layer (31) has a first electrical connecting portion (311), a second electrical connecting portion (312), a plurality of sensing areas (313), and a plurality of connecting lines (314).

\* \* \* \* \*